(12) United States Patent
Kim

(10) Patent No.: US 9,607,699 B2
(45) Date of Patent: Mar. 28, 2017

(54) MEMORY SYSTEM INCLUDING SEMICONDUCTOR MEMORY DEVICE AND OPERATING METHOD THEREOF

(71) Applicant: SK hynix Inc., Gyeonggi-do (KR)

(72) Inventor: Tae Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/990,272

(22) Filed: Jan. 7, 2016

(65) Prior Publication Data

US 2017/0025177 A1 Jan. 26, 2017

(30) Foreign Application Priority Data

Jul. 23, 2015 (KR) ........................ 10-2015-0104594

(51) Int. Cl.
*G11C 16/26* (2006.01)
*G11C 16/10* (2006.01)

(52) U.S. Cl.
CPC .............. *G11C 16/10* (2013.01); *G11C 16/26* (2013.01)

(58) Field of Classification Search
CPC ................................. G11C 16/26; G11C 16/10
USPC ........................................ 365/185.12, 185.24
See application file for complete search history.

(56) References Cited

U.S. PATENT DOCUMENTS

| 2013/0343125 A1* | 12/2013 | Gillingham ......... G11C 11/5628 365/185.03 |
| 2014/0059276 A1* | 2/2014 | Im ......................... G06F 3/0688 711/103 |
| 2014/0122773 A1* | 5/2014 | Abraham ............... G11C 16/10 711/103 |
| 2014/0281683 A1* | 9/2014 | Dusija ................. G06F 11/0754 714/6.11 |
| 2015/0349805 A1* | 12/2015 | Tsai .................. H03M 13/2906 714/755 |

FOREIGN PATENT DOCUMENTS

| KR | 1020110040457 | 4/2011 |
| KR | 1020120113853 | 10/2012 |
| KR | 1020130072669 | 7/2013 |

* cited by examiner

*Primary Examiner* — Michael Tran
(74) *Attorney, Agent, or Firm* — IP & T Group LLP

(57) ABSTRACT

An operating method of a memory system including first and second one half pages includes acquiring first and second partial data from main data; performing a first program operation to the first one half page of a selected page with the first partial data; and performing a second program operation to the second one half page of the selected page with the second partial data. The first and second partial data may be programmed in the same first column region in the first and second one half pages, respectively.

18 Claims, 16 Drawing Sheets

● EVEN MEMORY CELL
○ ODD MEMORY CELL

▨ REGION TO WHICH PD1 IS WRITTEN

▩ REGION TO WHICH PD2 IS WRITTEN

▫ REGION INCLUDING UNSELECTED MEMORY CELLS

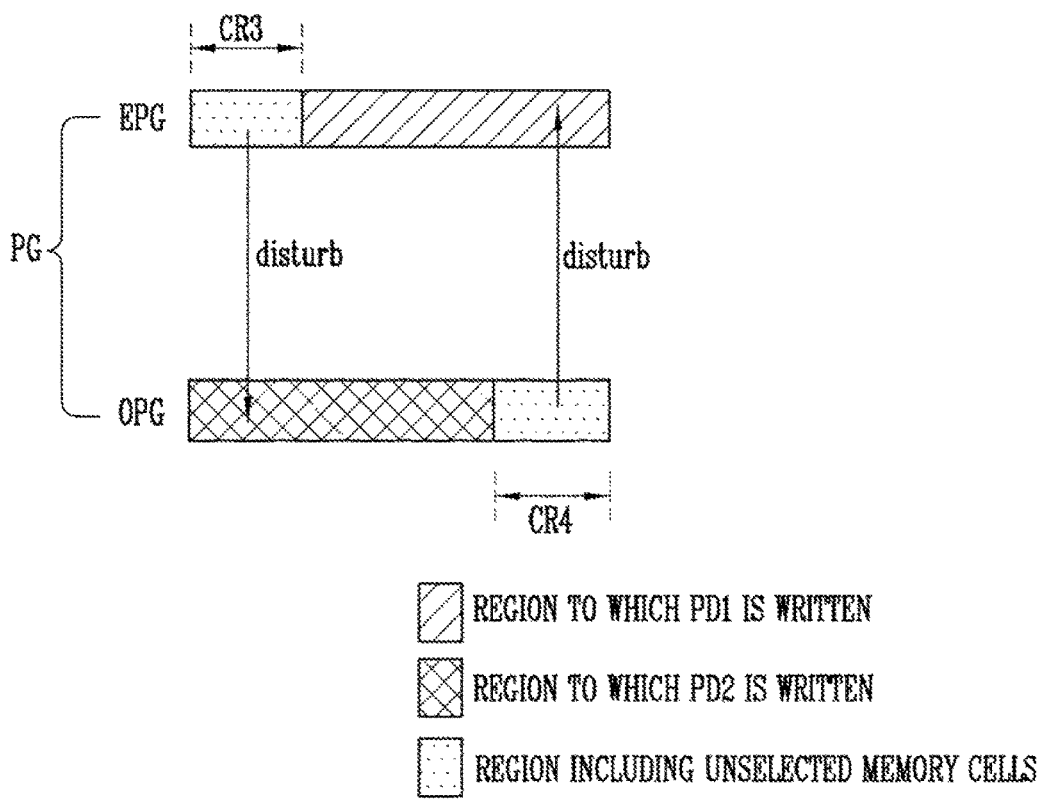

MEMORY SYSTEM INCLUDING SEMICONDUCTOR MEMORY DEVICE AND OPERATING METHOD THEREOF

CROSS-REFERENCE TO RELATED APPLICATION

The present application claims priority to Korean patent application number 10-2015-0104594, filed on Jul. 23, 2015, the entire disclosure of which is herein incorporated by reference in its entirety.

BACKGROUND

Field of Invention

Various embodiments relate generally to an electronic device, and more particularly, to a semiconductor memory device, a memory system including the semiconductor memory device and an operating method thereof.

Description of Related Art

Semiconductor memory devices are storage devices made of semiconductor materials such as silicon (Si), germanium (Ge), gallium arsenide (GaAs), and indium phosphide (Inp). Semiconductor memory devices are generally classified into volatile memory devices and non-volatile memory devices.

Volatile memory devices lose stored data when powered off. Examples of volatile memory devices include Static RAM (SRAM Dynamic RAM (DRAM) and Synchronous DRAM (SDRAM). Non-volatile memory devices retain stored data regardless of whether power to the device is on or off. Examples of non-volatile memory devices include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memory devices are classified into NOR- and NAND-type.

SUMMARY

Various embodiments of the present invention are directed to a semiconductor memory device, a memory system comprising the semiconductor memory device, and a method of operating the same. The present invention device, system and method exhibit improved reliability.

According to an embodiment of the invention, an operating method of a memory system is provided. The memory system may include a plurality of pages, each page including first and second one half pages. The method may include acquiring first and second partial data from main data; performing a first program operation to the first half page of a selected page with the first partial data; and performing a second program operation to the second half page of the selected page with the second partial data. The first and second partial data may be programmed in the same first column region in the first and second half pages, respectively.

First dummy data may be programmed in a second column region in the first half page during the first program operation. Second dummy data may be programmed in a second column region in the second half page during the second program operation.

Each of the first and second dummy data may have a predetermined data pattern.

The first program operation and the second program operation may be concurrently performed in response to a single program command.

The first program operation and the second program operation may be sequentially performed in response to different program commands.

The first column region may be arranged in a substantially middle location of each of the first and second half pages.

The size of the main data may be smaller than the size of an entire page.

The first and second partial data may have substantially the same size.

The first and second half pages may be arranged in an alternating pattern with each other.

According to another embodiment, a memory system is provided, the memory system comprising a semiconductor memory device including a plurality of pages. Each of the plurality of pages may include first and second one half pages. The device may include a controller suitable for acquiring first and second partial data from main data; performing a first program operation to the first half page of a selected page with the first partial data; and performing a second program operation to the second half page of the selected page with the second partial data. The controller may program the first and second partial data in the same first column region in the first and second half pages, respectively.

The controller may program first dummy data in a second column region in the first half page during a first program operation. The controller may program second dummy data in a second column region in the second half page during a second program operation.

Each of the first and second dummy data may have a predetermine data pattern.

The controller may concurrently perform the first program operation and the second program operation in response to a single program command.

The controller may sequentially perform the first program operation and the second program operation in response to different program commands.

The first column region may be arranged in a substantially intermediate arrangement respective to each of the first and second half pages.

The main data may have a smaller size than the size of an entire page.

The first and second partial data may have substantially the same size.

The first and second half pages may be arranged in an alternating pattern with each other.

According to an embodiment, a control method of a plurality of pages each including first and second half pages may include providing main data to be partially stored in a selected page; performing a main program operation to the same first column region in the first and second half pages of the selected page with the main data; and performing a dummy program operation to the same second column region in the first and second half pages of the selected page with dummy data during the main program operation.

The main data may comprise first and second partial data. The dummy data may comprise first and second dummy data. The performing of the main program operation may include: performing a first main program operation to the first column region in the first half page with the first partial data; and performing a second main program operation to the first column region in the second half page with the second partial data. The performing of the dummy program operation may include: performing a first dummy program operation to the second column region in the first half page with the first dummy data during the first main program operation; and performing a second dummy program operation to the second column region in the second half page with the second dummy data during the second main program operation.

BRIEF DESCRIPTION OF THE DRAWINGS

FIG. 12 is a table showing a relationship between column addresses and even and odd bit lines, according to an embodiment of the present invention;

FIG. 13 is a simplified illustration of an example of a region of an even page and a region of an odd page to which data is programmed, according to an embodiment of the present invention;

DETAILED DESCRIPTION

Hereinafter, various embodiments of the invention will be described with reference to the accompanying drawings. The figures and the embodiments are provided to allow those with ordinary skill in the art to understand the invention. The present invention may, however, be embodied in different forms and should not be construed as limited to the embodiments set forth. Rather, these embodiments are provided so that this disclosure will be thorough and complete.

Furthermore, 'connected/coupled' as used herein represents that one component is 'directly electrically' coupled to another component or 'indirectly electrically' coupled through another component.

Figure 1:
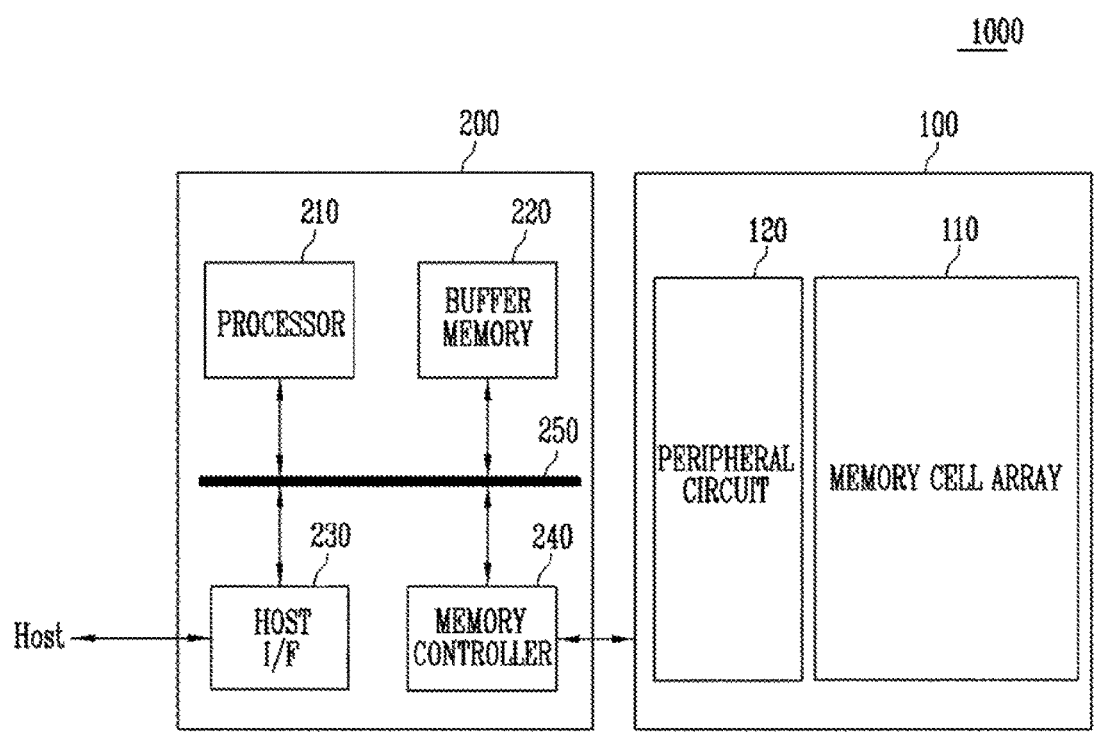
FIG. 1 is a block diagram illustrating a memory system, according to an embodiment of the present invention.

Referring now to FIG. 1, a memory system 1000 is provided, according to an embodiment of the invention. The memory system 1000 may include a semiconductor memory device 100 and a controller 200.

The semiconductor memory device 100 may operate under the supervision of the controller 200. The semiconductor memory device 100 may include a memory cell array 110 and a peripheral circuit 120 for driving the memory cell array 110. The memory cell array 110 may include a plurality of non-volatile memory cells.

The peripheral circuit 120 may operate under the control of the controller 200. For example, the peripheral circuit 120 may perform one or more operations under the control of the controller 200 including but not limited to: program the memory cell array 110 with data, read data from the memory cell array 110, output read data to the controller 200, and erase data stored in the memory cell array 110.

During a program operation, the peripheral circuit 120 may receive a program command, a physical block address and data from the controller 200. A single memory block and a single page included therein corresponding to the physical block address may then be selected. The peripheral circuit 120 may program a selected page with data.

During a read operation, the peripheral circuit 120 may receive a read command and a physical block address from the controller 200. A memory region, such as a single memory block and a single page corresponding to the physical block address, may then be selected. The peripheral circuit 120 may read data from the selected memory region and output the read data to the controller 200.

During an erase operation, the peripheral circuit 120 may receive an erase command and a physical block address from the controller 200. A memory region, such as a single memory block and a single page included therein, may then be selected by the physical block address. The peripheral circuit 120 may then erase data stored in the selected memory region.

The semiconductor memory device may be a non-volatile memory device. For example, the semiconductor memory device may be a ROM, MROM, PROM, EPROM, EEPROM, flash memory, PRAM, MRAM, RRAM, FRAM or the like. According to an embodiment, the semiconductor memory device 100 may be a flash memory device.

The controller 200 may control the semiconductor memory device 100. Hence when the controller 200 controls a write operation, the semiconductor memory device 100 may perform a program operation. When the controller 200 controls a read operation, the semiconductor memory device 100 may perform a read operation. When the controller 200 controls an erase operation, the semiconductor memory device 100 may perform an erase operation.

The controller 200 may include a processor 210, buffer memory 220, a host interface 230 and a memory controller 240.

The processor 210 may be coupled to a main bus 250. The processor 210 may control the general operations of the controller 200. The processor 210 may function as a flash translation layer (FTL). The processor 210 may receive request from a host through the host interface 230.

The processor 210 may translate a logical block address included in a request into a physical block address. When the request from the host is a program request, data may be further provided from the host. The processor 210 may generate a program command corresponding to the program request and store the program command, a physical block address and data in the buffer memory 220. The program command, the physical block address and the data stored in the buffer memory 220 may be transferred to the semiconductor memory device 100 by the memory controller 240.

According to an embodiment, the processor 210 may generate a program command, a physical block address and data without a request from the host and transfer the same to the semiconductor memory device 100, For example, the processor 210 may generate a program command, a physical block address and data for a background operation, such as a program operation for wear leveling or a program operation for garbage collection.

The buffer memory 220 may be coupled to the main bus 250. The buffer memory 220 may operate under the control of the processor 210. According to an embodiment, the buffer memory 220 may be or comprise an operation memory for the processor 210, a cache memory between the semiconductor memory device 100 and the host, a data buffer between the semiconductor memory device 100 and the host, or any combination thereof.

The host interface 230 may include a protocol to perform a communication between the host and the controller 200. According to an embodiment, the host interface 230 may communicate with the host through at least one of various protocols such as a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, and the like.

The memory controller 240 may be coupled to the main bus 250. The memory controller 240 may control the semiconductor memory device 100 under the control of the processor 210. The memory controller 240 may control a program operation by transferring the program command, the physical block address and the data stored in the buffer memory 220 to the semiconductor memory device 100 under the control of the processor 210.

Figure 2:
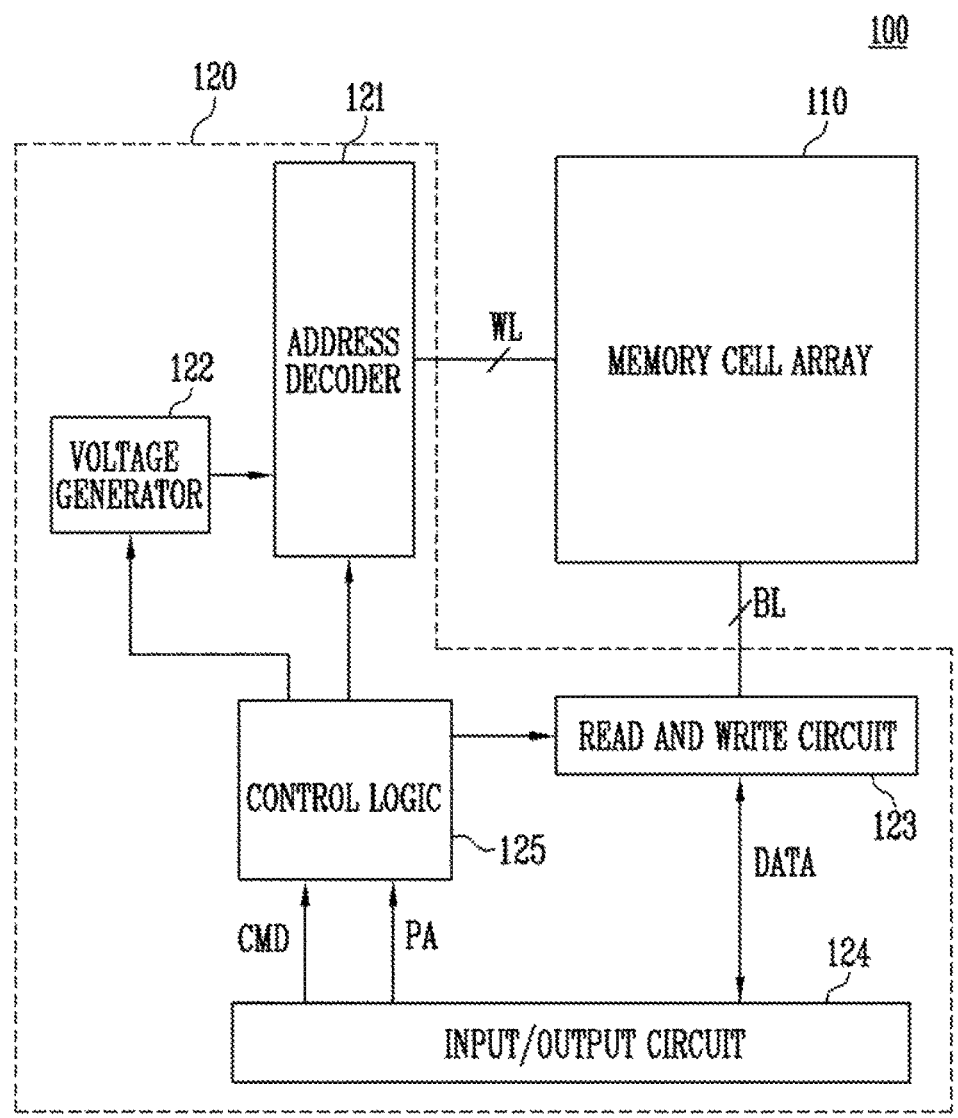
FIG. 2 is a block diagram illustrating a semiconductor memory device, according to an embodiment of the present invention.

Referring now to FIG. 2 an example of a semiconductor memory device, generally designated with numeral 100 is provided. The semiconductor memory device may be used with the memory system shown in FIG. 1.

Accordingly, the semiconductor memory device 100 may include the memory cell array 110 and the peripheral circuit 120.

Figure 3:
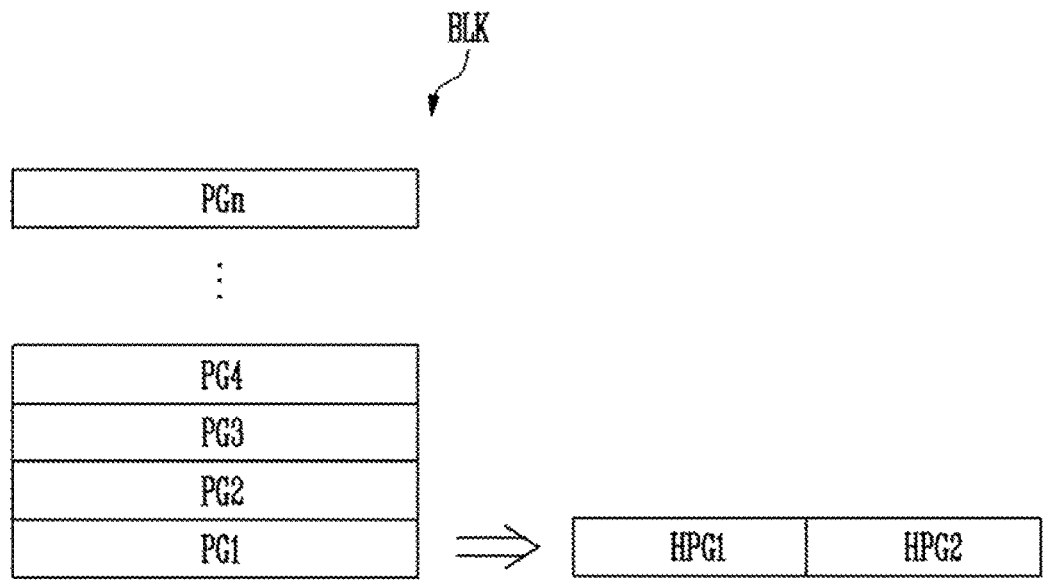
FIG. 3 is a block diagram illustrating a memory block employed in memory cell array of a semiconductor memory device as shown in FIG. 2, according to an embodiment of the present invention.

The memory cell array 110 may include a plurality of memory blocks. Each of the plurality of memory blocks may include a plurality of pages. For example as shown in the example of FIG. 3, one memory block BLK may include first to nth pages PG1 to PGn. Each of the pages may include first memory cells and second memory cells arranged alternately with the first memory cells. Each page may be divided in two parts. For example, each page may be divided in two one halves. The first memory cells may form a first one half page HPG1, and the second memory cells may form a second one half page HPG2. In other words, each page may include the first one half page HPG1 and the second one half page HPG2.

According to an embodiment, the first one half page HPG1 may include even memory cells and the second one half page HPG2 may include odd memory cells i.e., the first and second memory cells may be the even and odd memory cells, respectively. In this embodiment, the first one half page HPG1 may be defined as an even page and the second one half page HPG2 may be defined as an odd page. However, according to another embodiment, the first one half page HPG1 may include odd memory cells and the second half page HPG2 may include even memory cells (i.e., the first and second memory cells may be the odd and even memory cells, respectively). In such an embodiment, the first half page HPG1 may be referred to as an odd page, and the second half page HPG2 may be referred to as an even page.

Figure 4:
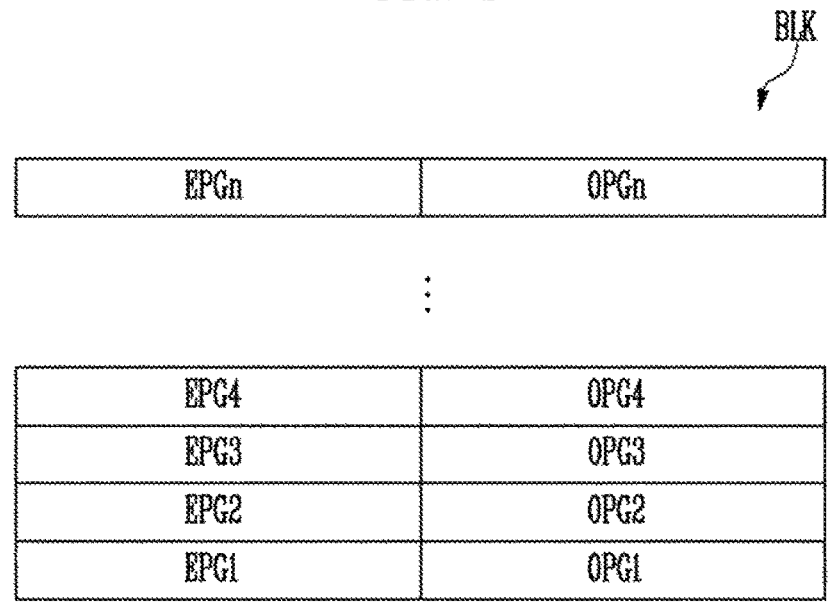
FIG. 4 is a block diagram illustrating a memory block including even and odd pages, according to an embodiment of the present invention.

Each page may be or include an even page or an odd page. As shown in FIG. 4, one memory block BLK may include first to nth even pages EPG1 to EPGn and first to nth odd pages OPG1 to OPGn.

Referring now again to FIG. 2, a memory cell array 110 may include a plurality of pages, the plurality of pages may be connected to word lines WL, respectively. In a single page, memory cells may be coupled to bit lines BL. Memory cells of an even page may be coupled to even bit lines, while memory cells of an odd page may be coupled to odd bit lines. The memory cells may be non-volatile memory cells. The memory cells may be volatile memory cells.

A program operation and a read operation of the semiconductor memory device 100 may be performed in units of pages. An erase operation of the semiconductor memory device 100 may be performed in units of memory blocks.

The peripheral circuit 120 may include an address decoder 121, a voltage generator 122, a read and write circuit 123, an input/output circuit 124 and a control logic 125.

The address decoder 121 may be coupled to the memory cell array 110 through the word lines WL. The address decoder 121 may operate under the control of the control logic 125.

The address decoder 121 may receive a physical block address PA through the control logic 125. A program operation of the semiconductor memory device 100 may be performed in units of pages. For example, during a program operation, the physical block address PA may include a block address and a row address.

The address decoder 121 may decode a block address of the physical block address PA. The address decoder 121 may select one of the memory blocks according to the decoded block address.

The address decoder 121 may decode a row address of the physical block address PA. The address decoder 121 may select a word line of the selected memory block according to the decoded row address, so that a single page may be selected.

According to an embodiment, the address decoder 121 may include an address buffer, a block decoder and a row decoder.

The voltage generator 122 may generate a plurality of voltages by using an external power voltage supplied to the semiconductor memory device 100. The voltage generator 122 may operate under the control of the control logic 125.

According to an embodiment, the voltage generator 122 may generate an internal power voltage by regulating the external power voltage. The internal power voltage generated by the voltage generator 122 may be used as an operating voltage of the semiconductor memory device 100.

The read and write circuit 123 may operate under the control of the control logic 125. The read and write circuit 123 may be coupled to the memory cell array 110 through the bit lines BL. The read and write circuit 123 may be coupled to the input/output circuit 124.

The read and write circuit 123 may decode a column address of the physical block address PA. The read and write circuit 123 may select a portion or entirety of the bit lines BL in response to the decoded column address.

During a program operation, the read and write circuit 123 may receive data DATA through the input/output circuit 124. The read and write circuit 123 may transfer the data DATA to corresponding memory cells of the selected page through the selected bit lines BL. According to an embodiment, the read and write circuit 123 may bias the selected bit lines BL to a program permission voltage (e.g., ground voltage) and a program inhibition voltage (e.g., power voltage) according to the data DATA. A memory cell coupled to a bit line to which the program permission voltage is applied may have an increased threshold voltage. A threshold voltage of the memory cell coupled to the bit line to which the program inhibition voltage is applied may be maintained.

The control logic 125 may be coupled to the address decoder 121, the voltage generator 122, the read and write circuit 123 and the input/output circuit 124. The control logic 125 may receive a command CMD and the physical block address PA from the controller 200. The control logic 125 may control the address decoder 121, the voltage generator 122, the read and write circuit 123 and the input/output circuit 124 in response to the command CMD. The control logic 125 may transfer the physical block address PA to the address decoder 121 and the read and write circuit 123.

Figure 5:
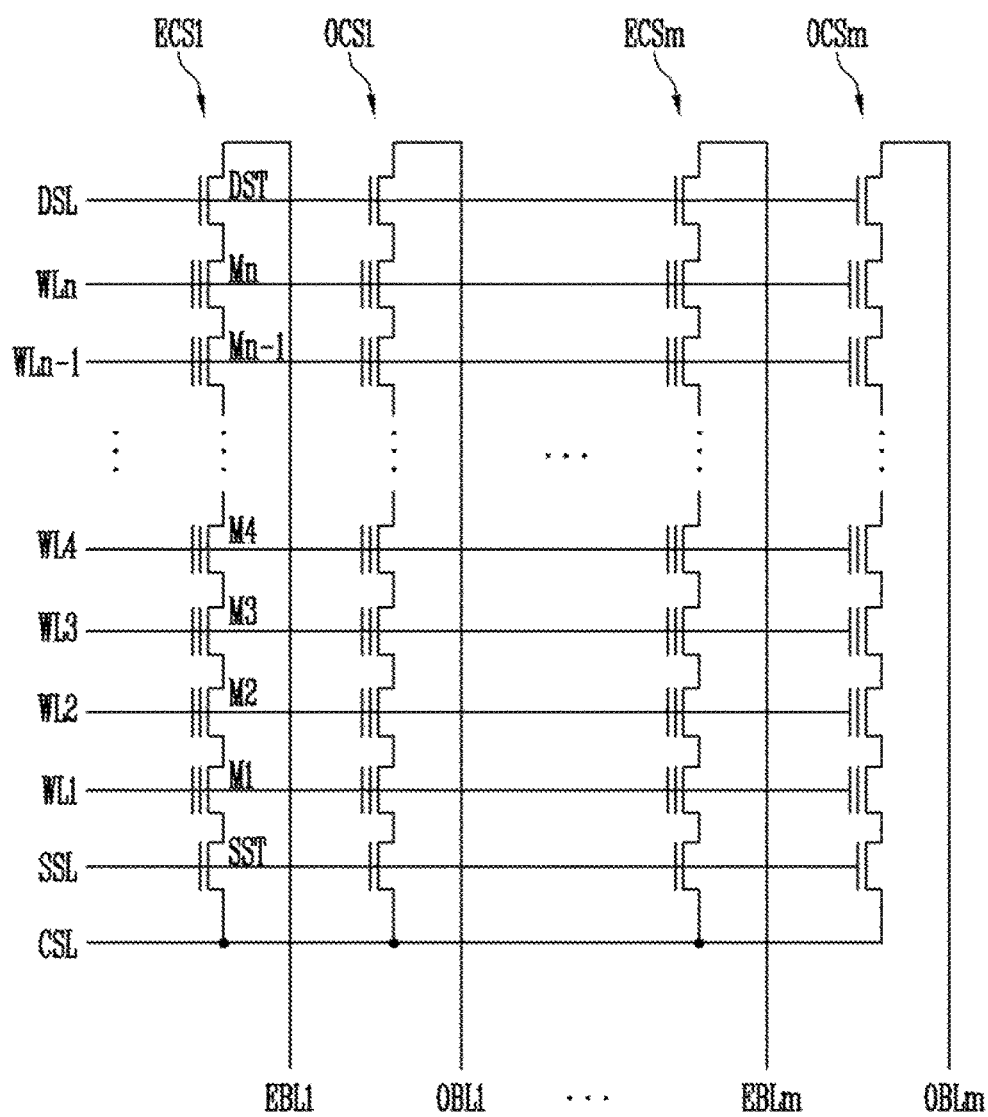
FIG. 5 is a circuit diagram illustrating a memory block included in a memory cell array of a semiconductor memory device as shown in FIG. 2, according to an embodiment of the present invention.

FIG. 5 illustrates one of the memory blocks of the memory cell array 110 of FIG. 1, generally designated with numeral 310. The remaining memory blocks of the cell array 110 may be configured in substantially the same manner as the memory block 310. The memory block 310 may include a plurality of even pages and a plurality of odd pages. The memory block 310 may be coupled to the read and write circuit 123 through first to mth even bit lines EBL1 to EBLm and first to mth odd bit lines OBL1 to OBLm. The memory block 310 may be coupled to the address decoder 121 through a common source line CSL, a source selection line SSL, first to nth word lines WL1 to WLn and a drain selection line DSL. The first to nth word lines WL1 to WLn may be included in the word lines WL shown in FIG. 1.

The memory block 310 may include a plurality of cell strings ECS1 to ECSm and OCS1 to OCSm. The first to mth even cell strings ECS1 to ECSm may be coupled to the first to mth even bit lines EBL1 to EBLm, respectively. The first to mth odd cell strings OCS1 to OCSm may be coupled to the first to mth odd bit lines OBL1 to OBLm, respectively. Each of the cell strings may include a source selection transistor SST coupled to the source selection line SSL, first to nth memory cells M1 to Mn coupled to first to nth word lines WL1 to WLn, respectively, and a drain selection transistor DST coupled to a drain selection line DST. In each single cell string, the source selection transistor SST, the first to nth memory cells M1 to Mn, and the drain selection transistor DST may be coupled in series with each other. The source selection transistor SST of each cell string may be coupled to the common source line CSL. The drain selection transistor DST of each cell string may be coupled to the corresponding bit line.

Memory cells coupled to a single word line of the even cell strings ECS1 to ECSm may form a single even page (EPG in FIG. 4). In the same manner, memory cells coupled to a single word line of the odd cell strings OCS1 to OCSm may form an odd page (OPG in FIG. 4). This way, the memory block 310 may include a plurality of even pages and a plurality of odd pages.

Figure 6:
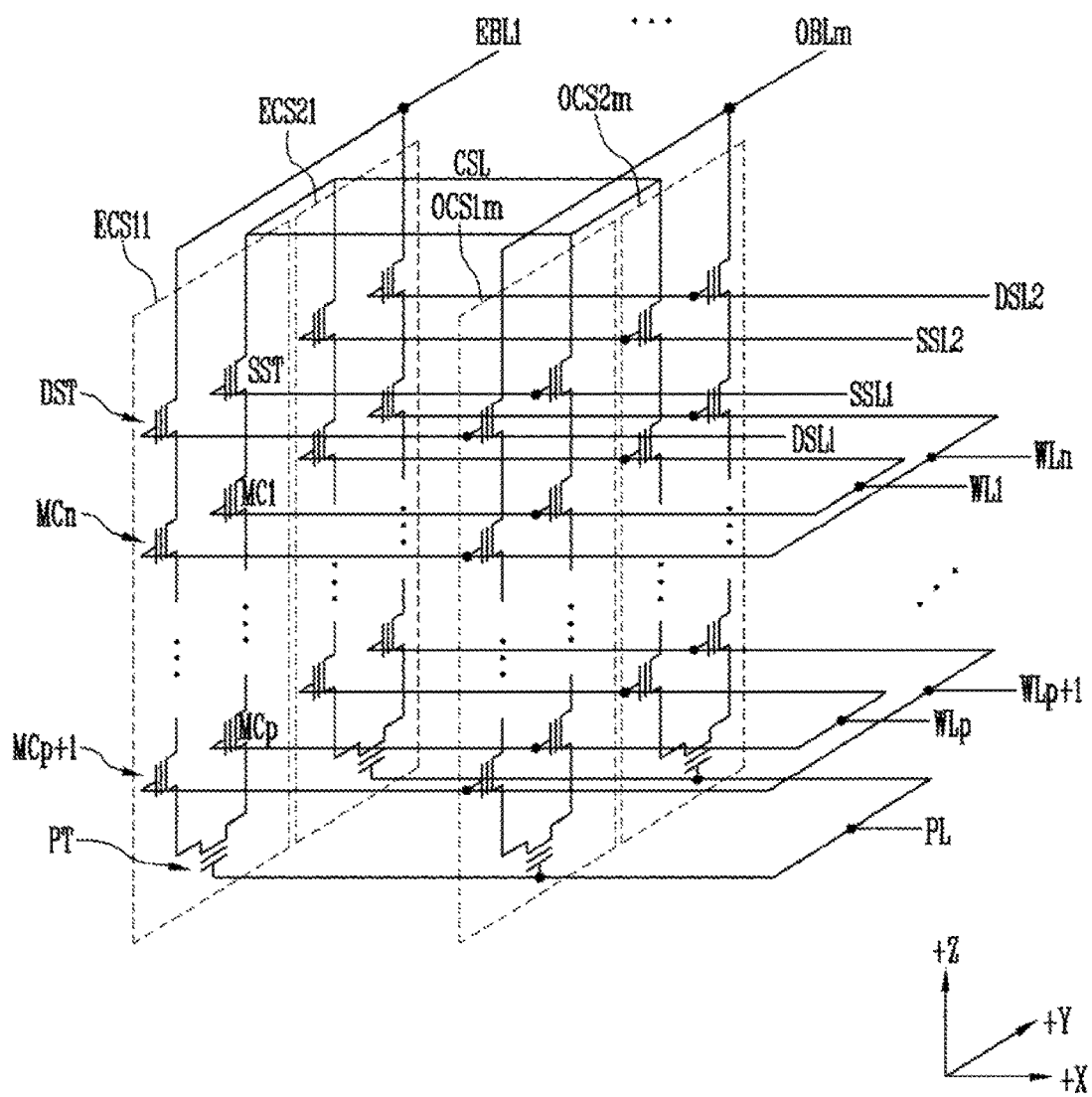
FIG. 6 is a circuit diagram illustrating another example of a memory block that may be included in a memory cell array of a semiconductor memory device as shown in FIG. 2, according to an embodiment of the present invention.

FIG. 6 is a circuit diagram illustrating another example 320 of a memory block that may be one of a plurality of memory blocks in the memory cell array 110. The remaining memory blocks may be configured in the same or substantially the same manner as the memory block 320.

The memory cell array 110 may have a three-dimensional structure. The memory block 320 may include a plurality of even pages and a plurality of odd pages. According to an embodiment, a memory cell having a three-dimensional structure is provided including a plurality of blocks, each block having a plurality of even pages and a plurality of odd pages.

Referring to FIG. 6, the memory block 320 may include a plurality of cell strings ECS and OCS. Each of the plurality of cell strings ECS and OCS may be formed in a 'U' shape. For convenience of explanation, FIG. 6 illustrates that two cell strings may be arranged in a column direction in the first memory block 320. However, more than two cell strings may be arranged in the column direction (i.e., +Y direction).

For convenience of explanation, FIG. 6 illustrates one (ECS11) of even cell strings in a first row. However, 'm' even cell strings ECS11 to ECS1m may be provided in the first row. Also, FIG. 6 illustrates one odd cell string OCS1m, among the odd cell strings in a first row. However, 'm' odd cell strings OCS11 to OCS1m may be provided in a first row.

In the same manner, m even cell strings ECS21 to ECS2m and m odd cell strings OCS21 to OCS2m may be provided in a second row.

The even cell strings ECS11 to ECS1m arranged in the first row and the odd cell strings OCS11 to OCS1m in the first row may be arranged alternately with one another in the X direction. Likewise, the even cell strings ECS21 to ECS2m arranged in the first row and the odd cell strings OCS21 to OCS2m in the second row may be arranged alternately with one another in the X direction.

Each of the cell strings may include the source selection transistor SST, a plurality of memory cells MC1 to MCn, a pipe transistor PT, and the drain selection transistor DST.

The election transistors SST and DST and the memory cells MC1 to MCn may have similar structures. According to an embodiment, each of the selection transistors SST and DST and the memory cells MC1 to MCn may include a channel layer, a tunneling insulating layer, a charge storage layer and a blocking insulating layer.

In each cell string, the memory cells MC1 to MCp and the source selection transistor SST may be stacked in a direction crossing a substrate (not illustrated) under the memory block 320, i.e., in a +Z direction. In each cell string, the memory cells MCp+1 to MCn and the drain selection transistor DST may be sequentially stacked in the +Z direction.

The source selection transistor SST of each cell string may be coupled between the common source line CSL and the memory cells MC1 to MCp. According to an embodiment, the source selection transistors of cell strings arranged in the same row (in +X direction) may be coupled to a source selection line extending in a row direction. The source selection transistors of cell strings arranged in different rows may be coupled to different source selection lines. The even cell strings ECS11 to ECS1m and the odd cell strings OCS11 to OCS1m arranged in the first row may be coupled to a first source selection line SSL1. The even cell strings ECS21 to ECS2m and the odd cell strings OCS21 to OCS2m arranged in the second row may be coupled to a second source selection line SSL2.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp and the (p+1)th to nth memory cells MCp+1 to MCn may be coupled through the pipe transistor PT.

The first to pth memory cells MC1 to MCp may be coupled in series between the source selection transistor SST and the pipe transistor PT. The (p+1)th to nth memory cells MCp+1 to MCn may be coupled in series between the pipe transistor PT and the drain selection transistor DST. Gates of the first to nth memory cells MC1 to MCn may be coupled to the first to nth word lines WL1 to WLn, respectively.

The gate of the pipe transistor PT of each cell string may be coupled to the pipe line PL.

The drain selection transistor DST of each cell string may be coupled between the corresponding bit line and the memory cells MCp+1 to MCn. According to an embodiment, drain selection transistors of cell strings arranged in the same row may be coupled to a drain selection line extending in a row direction. Drain selection transistors of cell strings arranged in different rows may be coupled to different drain selection lines. The even cell strings ECS11 to ECS1m and the odd cell strings OCS11 to OCS1m arranged in the first row may be coupled to the first drain selection line DSL1. The even cell strings ECS21 to ECS2m and the odd cell strings OCS21 to OCS2m arranged in the second row may be coupled to a second drain selection line DSL2.

Two cell strings arranged in a column direction (+Y direction) may be coupled to a bit line extending in the column direction. The even bit lines EBL1 to EBLm may be arranged alternately with the odd bit lines OBL1 to OBLm in the X direction. Each of the even bit lines EBL1 to EBLm may be coupled to even cell strings. Each of the odd bit lines OBL1 to OBLm may be coupled to odd cell strings.

Memory cells coupled to the same word line in the even cell strings ECS11 to ECS1m in the first row may form one even page (EPG in FIG. 4). Memory cells coupled to the same word line in the odd cell strings OCS11 to OCS1m in the first row may form one odd page (OPG in FIG. 4). In addition, memory cells coupled to the same word line in the even cell strings ECS21 to ECS2m in the second row may form one even page, and memory cells coupled to the same word line in the odd cell strings OCS21 to OCS2m in the second row may form one odd page.

Figure 7:
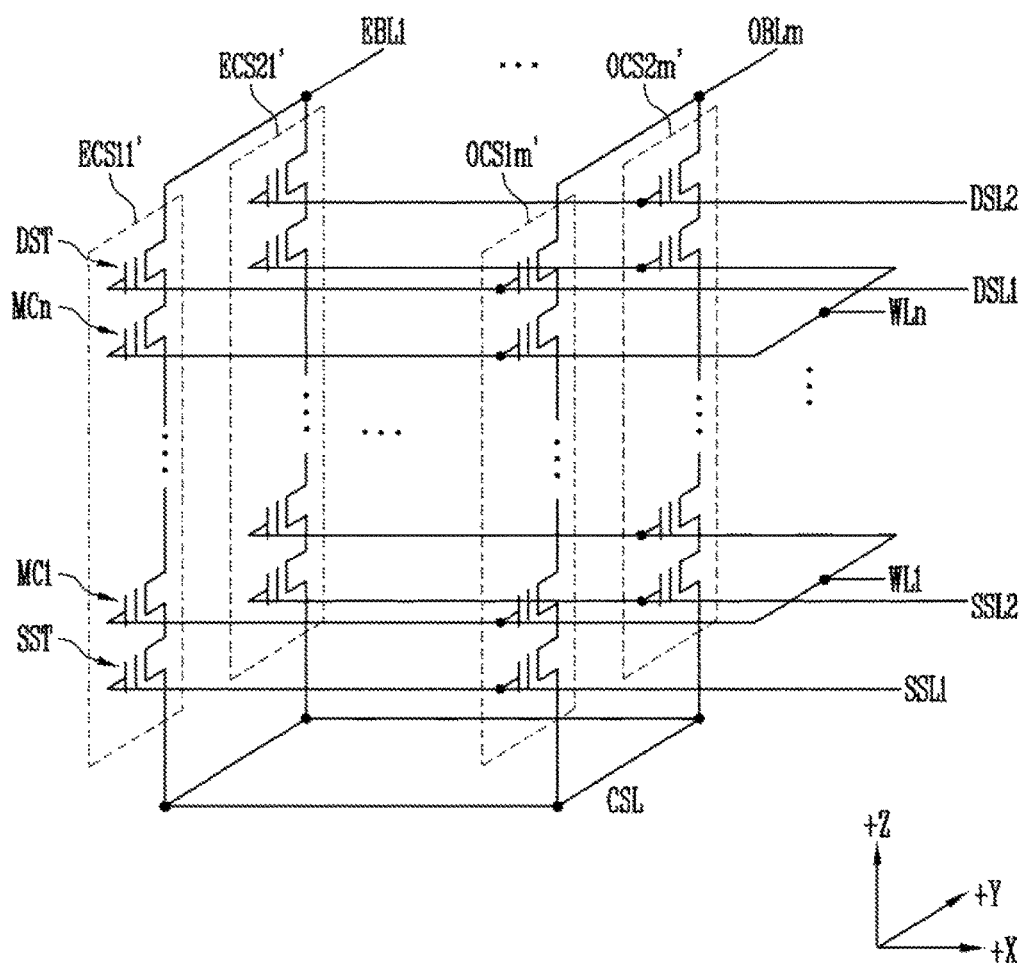
FIG. 7 is a circuit diagram illustrating another example of a memory block that may be employed in a memory cell array of a semiconductor device as shown in FIG. 2, according to an embodiment of the present invention.

FIG. 7 is a circuit diagram illustrating another example of a memory block 330. Memory block 330 is one of a plurality of memory blocks included in the memory cell array 110. FIG. 7 illustrates only one of the memory blocks for convenience. However, it should be understood, that the remaining memory blocks may be configured in the same or substantially the same manner as the memory block 330.

Referring now to FIG. 7, each of the cell strings of the memory block 330 may extend in a +Z direction.

Also, for convenience of explanation, FIG. 7 illustrates only one of the even cell strings and only of the odd cell strings in the first row, i.e., even cell string ECS11 and odd cell string OCS1m'. However, ' m' even cell strings ECS11' to ECS1m' and 'm' odd cell strings OCS11' to OCS1m' may be provided in the first row.

In the same manner, m even cell strings ECS21' to ECS2m' and m odd cell strings OCS21' to OCS2m' may be provided in the second row.

The even cell strings ECS11' to ECS1m' arranged in the first row may be arranged alternately with the odd cell strings OCS11' to OCS1m' arranged in the first row. The even cell strings ECS21' to ECS2m' arranged in the second row may be arranged alternately with the odd cell strings OCS21' to OCS2m' in the second row.

Each of the cell strings may include the source selection transistor SST, the first to nth memory cells MC1 to MCn, and the drain selection transistor DST.

The selection transistors SST and DST and the memory cells MC1 to MCn may have similar structures. According to an embodiment, each of the selection transistors SST and DST and the memory cells MC1 to MCn may include a channel layer, a tunneling insulating layer, a charge storage layer and a blocking insulating layer.

In each cell string, the source selection transistor SST, the first to nth memory cells MC1 to MCn and the drain selection transistor DST may be sequentially stacked in a +Z direction crossing a substrate (not illustrated) under the memory block 330.

The source selection transistor SST of each cell string may be coupled between the common source line CSL and the memory cells MC1 to MCn. According to an embodiment, source selection transistors of cell strings arranged in the same row (+X direction) may be coupled to a source selection line extending in a row direction. Source selection transistors of cell strings arranged in different rows may be coupled to different source selection lines. The even cell strings ECS11' to ECS1m' and the odd cell strings OCS11' to OCS1m' arranged in the first row may be coupled to the first source selection line SSL1. The even cell strings ECS21' to ECS2m' and the odd cell strings OCS21' to OCS2m' arranged in the second row may be coupled to the second source selection line SSL2.

In each cell string, the first to nth memory cells MC1 to MCn may be coupled in series between the source selection transistor SST and the drain selection transistor DST. The first to nth memory cells MC1 to MCn may be coupled to the first to nth word lines WL1 to WLn, respectively.

The drain selection transistor DST of each cell string may be coupled between the corresponding bit line and the memory cells MC1 to MCn. The even cell strings ECS11' to ECS1m' and the odd cell strings OCS11' to OCS1m' arranged in the first row may be coupled to the first drain selection line DSL1. The even cell strings ECS21' to ECS2m' and the odd cell strings OCS21' to OCS2m' arranged in the second row may be coupled to the second drain selection line DSL2.

As a result, except that the pipe transistor PT is removed from each cell string, the memory block 330 shown in FIG. 7 may have an equivalent circuit similar to the memory block 320 shown in FIG. 6.

Memory cells coupled to the same word line in the even cell strings ECS11' to ECS1m' in the first row may form a single even page EPG in FIG. 4. Memory cells coupled to the same word line in the odd cell strings OCS11' to OCS1m' in the first row may form one odd page (OPG In FIG. 4). In addition, memory cells coupled to the same word line in the even cell strings ECS21' to ECS2m' in the second row may form one even page. Memory cells coupled to the same word line in the odd cell strings OCS21' to OCS2m' in the second row may form one odd page.

It will be apparent from the aforementioned description made with reference to FIGS. 6 and 7, that a three-dimensional memory cell array may be implemented in various embodiments without departing from the scope of the present invention. For example, various embodiments may be thought by the skilled person after having read the present disclosure wherein, a memory block of a memory cell array may include a plurality of pages, and each page may include an even page and an odd page.

Figure 8:
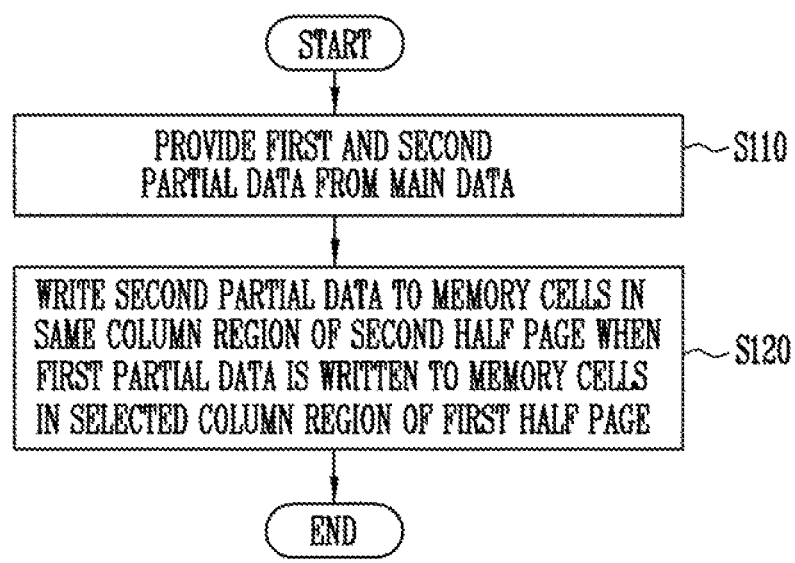
FIG. 8 is a flowchart illustrating an operating method of a memory system, according to an embodiment of the present invention.

FIG. 8 is a flowchart Illustrating an example of an operating method of the memory system 100 of FIG. 1. Accordingly, referring to FIGS. 1 and 8, at step S110, the controller 200 may provide first and second partial data from main data. The main data may refer to data to be programmed to the semiconductor memory device 100.

The main data may be stored in a part of the single page (PG in FIG. 3). The size of the main data may be smaller than the whole size of a single page. For example, when the whole size of a single page is 8 (eight) kilobytes, the size of the main data may be less than 8 kilobytes.

According to an embodiment, the main data may be generated from the data provided from a host. The main data may be generated by randomizing the data provided from the host. An element for randomization may be further provided in the controller 200. According to an embodiment, the main data may be generated by adding parity bits through an error correction code to the data provided from the host. An element for the error correction encoding may be further provided in the controller 200. According to an embodiment, the main data may be generated by the controller 200.

At step S120, when the first partial data is programmed to memory cells of a selected column region in the first half page HPG1, the controller 200 may write the second partial data in memory cells of the same column region of the second half page HPG2. The column region may refer to a region including physically neighboring bit lines. For example, the column region may refer to a region comprising a plurality of neighboring even bit lines and a plurality of neighboring odd bit lines alternating with the even bit lines.

For convenience of explanation, it is assumed that the first one half page HPG1 is an even page and the second half page HPG2 is an odd page.

Figure 9:
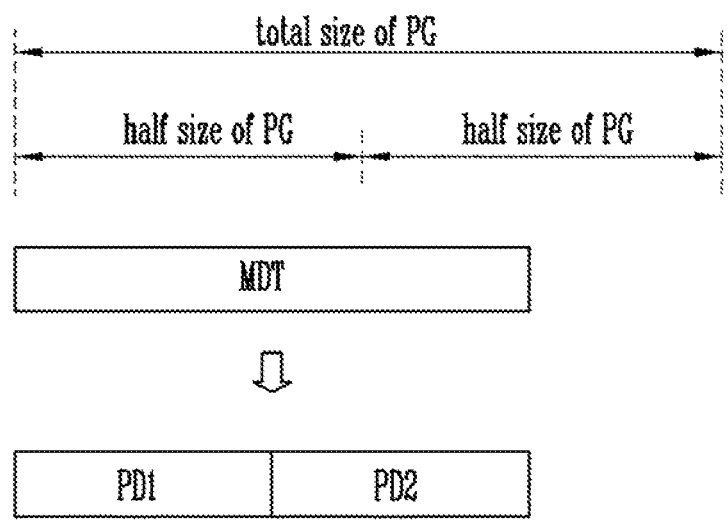
FIG. 9 is simplified illustration of main, first partial and second partial data, according to an embodiment of the present invention.

Referring to FIG. 9, the main data MDT may have a smaller size than a page PG. According to an embodiment, the size of the main data MDT may be greater than the size of one half of the page PG. According to another embodiment, the size of the main data MDT may be smaller than the size of one half of the page PG.

The first and second partial data PD1 and PD2 may be provided from the main data MDT. The first partial data PD1 and the second partial data PD2 may have almost the same size. According to an embodiment, the size of each of the first and second partial data PD1 and PD2 may be one half of the total size of the main data MDT.

The processor 210 may store the first and second partial data PD1 and PD2 in the buffer memory 220.

Figure 10:
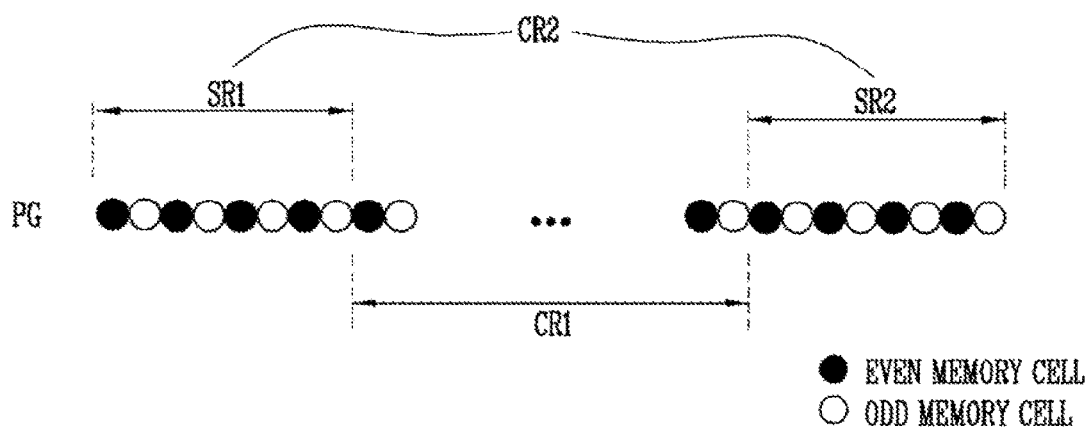
FIG. 10 is a simplified illustration of a first column region and a second column region, according to an embodiment of the present invention.

FIG. 10 illustrates a first column region CR1 and a second column region CR2 according to an embodiment of the present invention.

Referring now to FIG. 10, the page PG may include even memory cells and odd memory cells, as described also earlier with reference to FIGS. 4 to 7. The even memory cells and the odd memory cells may alternate with each other.

A selected column region may be defined. The size of the selected column region may be determined by the size of the first and second partial data PD1 and PD2. The selected column region may be defined so that the selected column region may include the same number of even member cells (or odd memory cells) as the number of data bits in one of the first and second partial data PD1 and PD2.

FIG. 10 illustrates a selected column region indicated as the first column region CR1 and an unselected column region indicated as the second column region CR2. The second column region CR2 may include first and second sub-regions SR1 and SR2. FIG. 10 exemplifies that the first column region CR1 may be located intermediate or between first and second sub-regions SR1 and SR2 on a selected page.

The first partial data PD1 may be programmed to even memory cells included in the first column region CR1 (i.e., memory cells corresponding to the first column region CR1 of the even page). The second partial data PD2 may be programmed to odd memory cells included in the same column region CR1 (i.e., memory cells corresponding to the first column region CR1 of the odd page).

Figure 11:
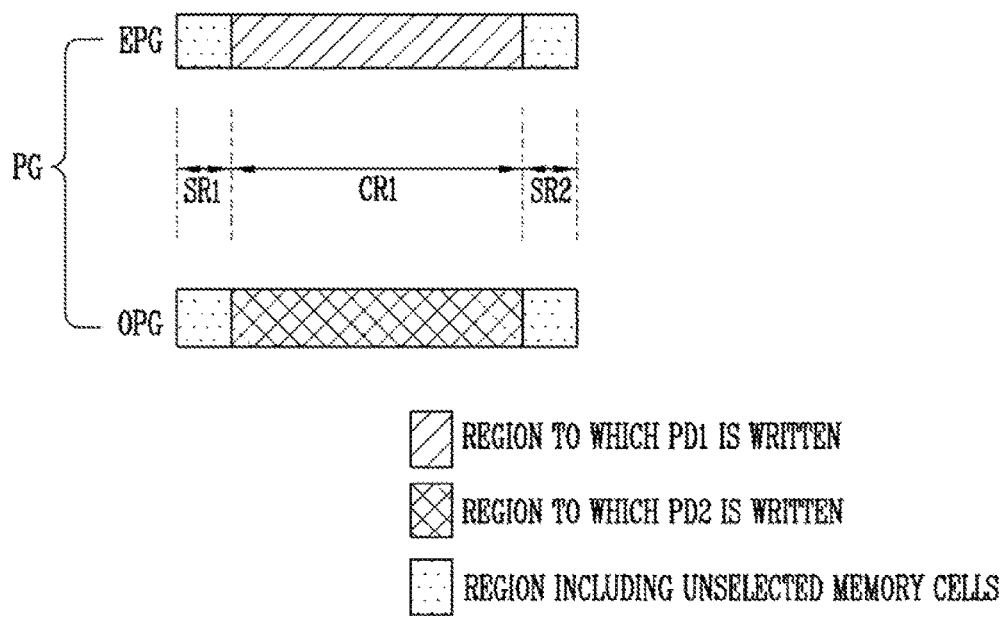
FIG. 11 is a simplified illustration of a region of an even page and an odd page to which data is programmed, according to an embodiment of the present invention.

FIG. 11 illustrates a memory region comprising an even page EPG and an odd page OPG to which data is programmed, according to an embodiment of the invention.

Referring now to FIG. 11, data may be programmed to the memory cells of the first column region CR1 in both of the even and odd pages EPG and OPG of the selected page PG. The first partial data PD1 may be programmed to the memory cells of the first column region CR1 in the even page EPG while the memory cells of the first and second sub-regions SR1 and SR2 in the even page EPG may be kept erased or remain unselected. The second partial data PD2 may be stored in the memory cells of the first column region CR1 in the odd page OPG while the memory cells of the first and second sub-regions SR1 and SR2 in the odd page OPG may be kept erased or remain unselected. In other words, main data may be programmed to the memory cells corresponding to the same column region CR1 in the even page EPG and the odd page OPG.

The processor 210 may generate a program command and a physical block address when the first and second partial data PD1 and PD2 are programmed. The physical block address may include a block address, a row address and a column address. A portion or all of the memory cells included in a single page may be selected in response to the physical block address. The column address in the physical block address may indicate the memory cells of the first column region CR1 in the even page EPG and the memory cells of the first column region CR1 in the odd page OPG.

The memory controller 240 may control the program operation of the semiconductor memory device 100 by transferring the program command, the physical block address and the first and second partial data PD1 and PD2 to the semiconductor memory device 100 under the control of the processor 210. The semiconductor memory device 100 may select a single page in response to the block address and the row address of the physical block address. The semiconductor memory device 100 may select memory cells of the first column region CR1 in the even page EPG and memory cells of the first column region CR1 in the odd page OPG in response to the column address of the physical block address. The semiconductor memory device 100 may program the first partial data PD1 into the memory cells of the first column region CR1 in the even page EPG of the selected page, and may program the second partial data PD2 into the memory cells of the first column region CR1 in the odd page OPG of the selected page.

FIG. 12 is a table showing a relationship between column addresses and even and odd bit lines EBL1 to EBLm and OBL1 to OBLm, respectively, according to an embodiment of the present invention.

For example, as illustrated in FIG. 12, zeroth to (m−1)th column addresses CADDR0 to CADDRm−1 may be assigned to the first to mth even bit lines EBL1 to EBLm, respectively. Also, mth to (2m−1)th column addresses CADDRm to CADDR(2m−1)th may be assigned to the first to mth odd bit lines OBL1 to OBLm, respectively.

In the embodiment shown, Pth to (m−q)th column addresses CADDRp to CADDRm-q and (m+p)th to (2m−q)th column addresses CADDRm+p to CADDR2m-q are selected for the selected column region or the first column region CR1 in the even and odd pages, respectively (p and q are natural numbers greater than 0 and smaller than m). The pth to (m−q)th column addresses CADDRp to CADDRm−q may represent the first column region CR1 in the even page (EPG In FIG. 11). The (m+p)th to (2m−q)th column addresses CADDRm+p to CADDR2m-q may represent the first column region CR1 in the odd page (OPG in FIG. 11).

As Illustrated in FIG. 13, a selected column region in the even page EPG in which the first partial data PD1 is stored and a selected column region in the odd page OPG in which the second partial data PD2 is stored may be different from each other. Hence, selected even memory cells and selected odd memory cells may be located in different column regions.

Unselected even memory cells may be located in the third column region CR3 as illustrated in FIG. 13. The unselected even memory cells of the third column region CR3 may cause disturbance to the selected odd memory cells corresponding to the third column region CR3 in the odd page OPG. Likewise, unselected odd memory cells may be located in the fourth column region CR4 as illustrated in FIG. 13. The unselected odd memory cells of the fourth column region CR4 may cause disturbance to the selected even memory cells corresponding to the fourth column region CR4 in the even page EPG.

Even memory cells and odd memory cells may be arranged alternately with each other. Alternating the even and odd memory cells may be advantageous.

For example, a channel of a cell string including an unselected even memory cell may be boosted during the program operation. In case of storing the data, according to which the selected column region of the even page EPG and the selected column region of the odd page OPG are different from each other as illustrated in FIG. 13, the boosted voltage for the unselected even memory cell may disturb the program operation to a neighboring selected odd memory cell. When a plurality of unselected even memory cells are located in the third column region CR3, the program operation to the selected odd memory cells corresponding to the third column region CR3 in the odd page OPG may be disturbed. A threshold voltage of the unselected even memory cell may be lower than a voltage (e.g., a ground voltage) corresponding to an erase state. A threshold voltage of the selected odd memory cell may be increased according to data to be stored in the selected odd memory cell. However, as a result of the disturbance, threshold voltages of the selected odd memory cells located in the third column region CR3 may not rise to an expected level due to the low voltage (e.g., a ground voltage) of the erase state of the unselected even memory cells corresponding to the third column region CR3.

According to an embodiment, when main data is programmed in part of a single page, the main data may be programmed to the same column region in both of the even page EPG and the odd page OPG, as exemplified with reference to FIG. 11. Therefore, the main data may be stably programmed to a single page without the disturbance. Therefore, the memory system 1000 having improved reliability may be provided.

Figure 14:
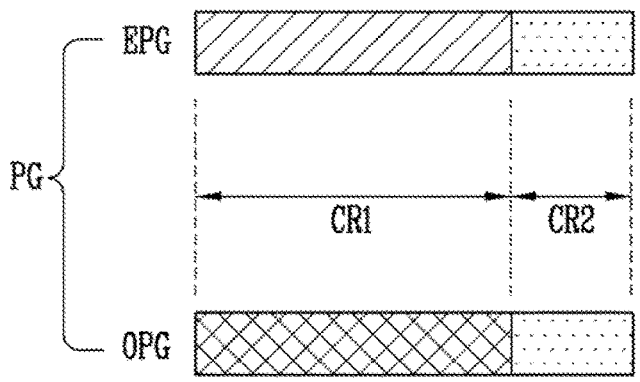
FIG. 14 is a simplified illustration of another example of a region of an even page and an odd page to which data is programmed, according to an embodiment of the present invention.

FIG. 14 illustrates another example of a region of the even page EPG and the odd page OPG to which data is programmed.

Referring to FIG. 14, the first column region CR1 may be defined on the left side of the even page EPG and the odd page OPG. The second column region CR2 may be defined on the right side of the even page EPG and the odd page OPG. The first partial data PD1 may be programmed to the memory cells of the first column region CR1 in the even page EPG, and the second partial data PD2 may be programmed to the memory cells of the same column region CR1 in the odd page OPG. The even memory cells and the odd memory cells of the second column region CR2 may be kept erased or remain unselected.

For example, when column addresses are assigned to the even bit lines EBL1 to EBLm and the odd bit lines OBL1 to OBLm as described with reference to FIG. 12, zeroth to rth column addresses CADDR0 to CADDRr may be selected for the first column region CR1 in the even page EPG, and mth to (m+r)th column addresses CADDRm to CADDRm+r may be selected for the first column region CR1 in the odd page OPG.

Figure 15:
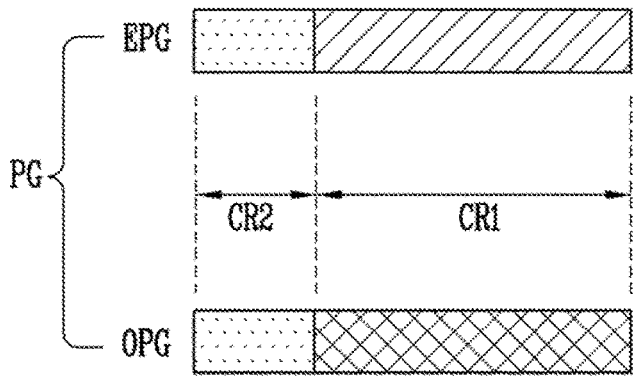
FIG. 15 is a simplified illustration of another example of a region of an even page and a region of an odd page in which data is programmed, according to an embodiment of the present invention.

FIG. 15 illustrates another example of a region of the even page EPG and the odd page OPG to which data is programmed.

Referring to FIG. 15, the first column region CR1 may be defined on the right side of the even page EPG and the odd page OPG. The second column region CR2 may be defined on the left side of the even page EPG and the odd page OPG. The first partial data PD1 may be programmed to the memory cells of the first column region CR1 in the even page EPG, and the second partial data PD2 may be programmed to the memory cells of the same column region CR1 in the odd page OPG. The even memory cells and the odd memory cells of the second column region CR2 may be kept erased or remain unselected.

For example, when column addresses are assigned to the even bit lines EBL1 to EBLm and the odd bit lines OBL1 to OBLm as described with reference to FIG. 12, (m−x)th to mth−1 column addresses CADDRm−x to CADDRm−1 may be selected for the first column region CR1 in the even page EPG, and (2m-x)th to (2m-1)th column addresses CADDR2m-x to CADDR(2m-1)th may be selected for the first column region CR1 in the odd page OPG.

Figure 16:
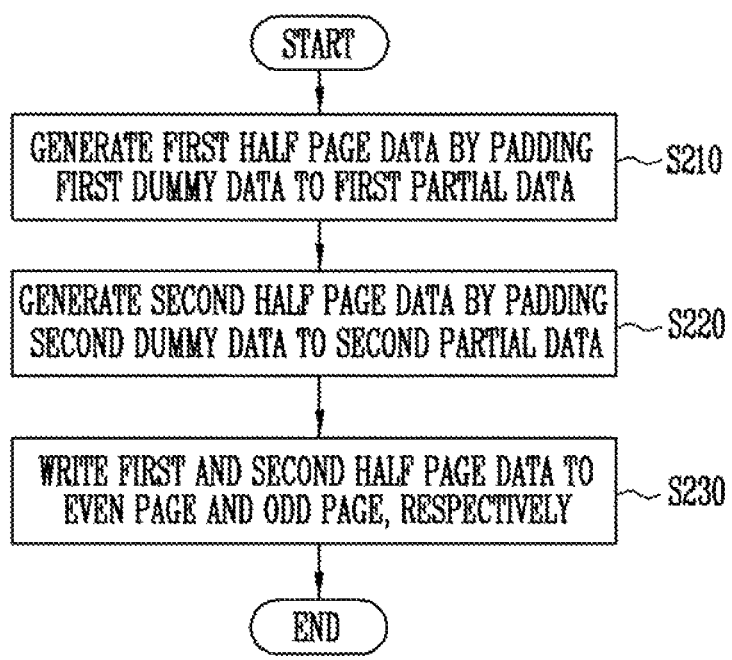
FIG. 16 is a flowchart illustrating an example of step S120 of FIG. 8, according to an embodiment of the present invention.
Figure 17:
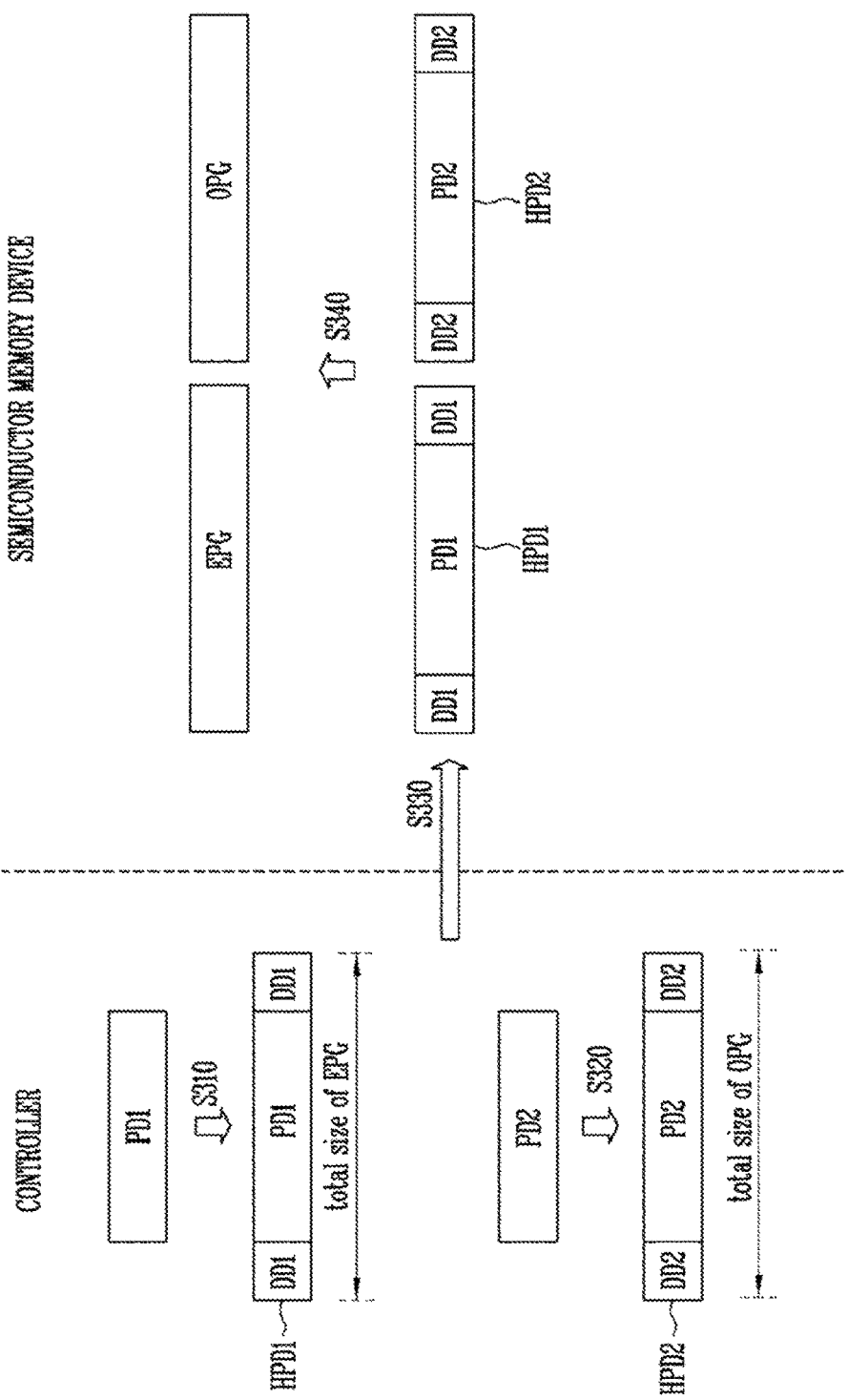
FIG. 17 is an illustration of a program operation of first and second half page data, according to an embodiment of the present invention.

As described with reference to FIGS. 11, 14, and 15, the first column region CR1 and the second column region CR2 may be variously located. FIG. 16 is a flowchart illustrating an example of step S120 of the method shown in FIG. 8. FIG. 17 illustrates a program operation of first and second half page data HPD1 and HPD2 according to step S120 as shown in FIG. 16.

Referring now to FIGS. 1, 8, 16 and 17, at steps S210 and S310, the controller 200 may generate the first half page data HPD1 by padding first dummy data DD1 to the first partial data PD1. The first dummy data DD1 may be padded so that the first partial data PD1 may be programmed to the memory cells of the first column region CR1 in the even page EPG and the first dummy data DD1 may be programmed to memory cells of the second column region CR2 in the even page EPG, as exemplified in FIGS. 11 and 17. The first half page data HPD1 may be stored in the buffer memory 220.

According to an embodiment, the size of the first one half page data HPD1 may be the same as the entire size of the even page EPG in the selected page.

At step S220 and S320, the controller 200 may generate second one half page data HPD2 by padding second dummy data DD2 to the second partial data PD2. The second dummy data DD2 may be padded so that the second partial data PD2 may be programmed to the memory cells of the first column region CR1 in the odd page OPG and the second dummy data DD2 may be programmed to the memory cells of the second column region CR2 in the odd page OPG, as exemplified in FIGS. 11 and 17. The second one half page data HPD2 may be stored in the buffer memory 220.

According to an embodiment, the size of the second one half page data HPD2 may be the same as the total size of the odd page OPG in the selected page.

Each of the first and second dummy data DD1 and DD2 may have a predetermined data pattern. According to the predetermined data pattern, threshold voltages of the selected memory cells which store data therein may be prevented from being changed by threshold voltages of the unselected memory cells which do not store data therein. Subsequently, the controller 200 may provide a command to the semiconductor memory device 100 to write the first and second half page data HPD1 and HPD2 (S330).

At step S230 and step S340, the controller 200 may control the semiconductor memory device 100 to perform the program operation to the even and odd pages EPG and OPG in the selected page with the first and second half page data HPD1 and HPD2, respectively.

According to an embodiment, the first and second one half page data HPD1 and HPD2 may be programmed into the even page EPG and the odd page OPG through a single program operation. For example, the controller 200 may control the single program operation by transferring the program command, a physical block address corresponding to the even page EPG and the odd page OPG, and the first and second half page data HPD1 and HPD2 to the semiconductor memory device 100. A column address of the physical block address may represent both of the even page EPG and the odd page OPG, or the entire selected page.

According to another embodiment, the first and second half page data HPD1 and HPD2 may be programmed into the even page EPG and the odd page OPG through different program operations. For example, the controller 200 may control the different program operations by transferring a first program command, the first physical block address corresponding to the even page EPG, and the first half page data HPD1 to the semiconductor memory device 100. A column address included in the first physical block address may represent the even page EPG in the selected page. And then, the controller 200 may control the different program operations by transferring a second program command, a second physical block address corresponding to the odd page OPG, and the second half page data HPD2 to the semiconductor memory device 100. The column address included in the second physical block address may represent the odd page OPG of the selected page.

Figure 18:
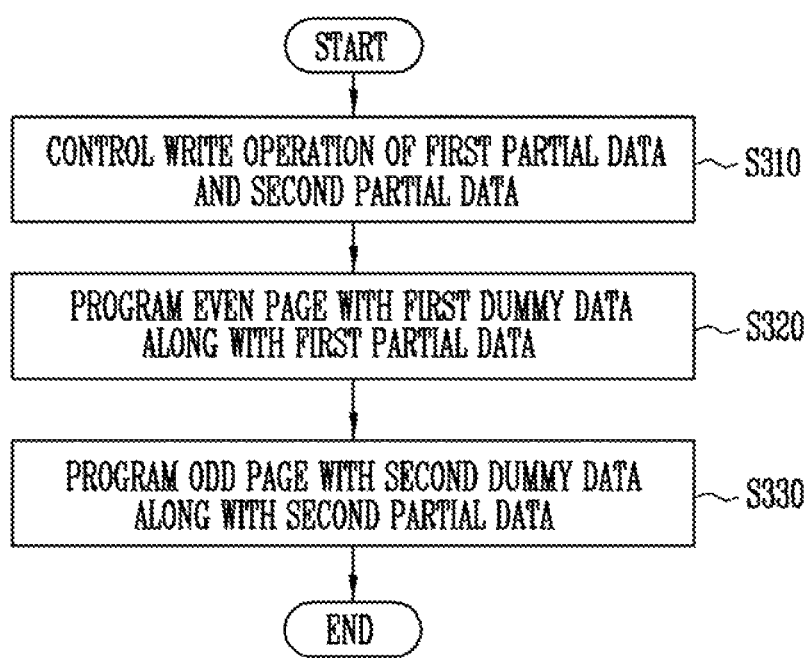
FIG. 18 is a flowchart illustrating another example of step S120 of FIG. 8, according to an embodiment of the present invention.
Figure 19:
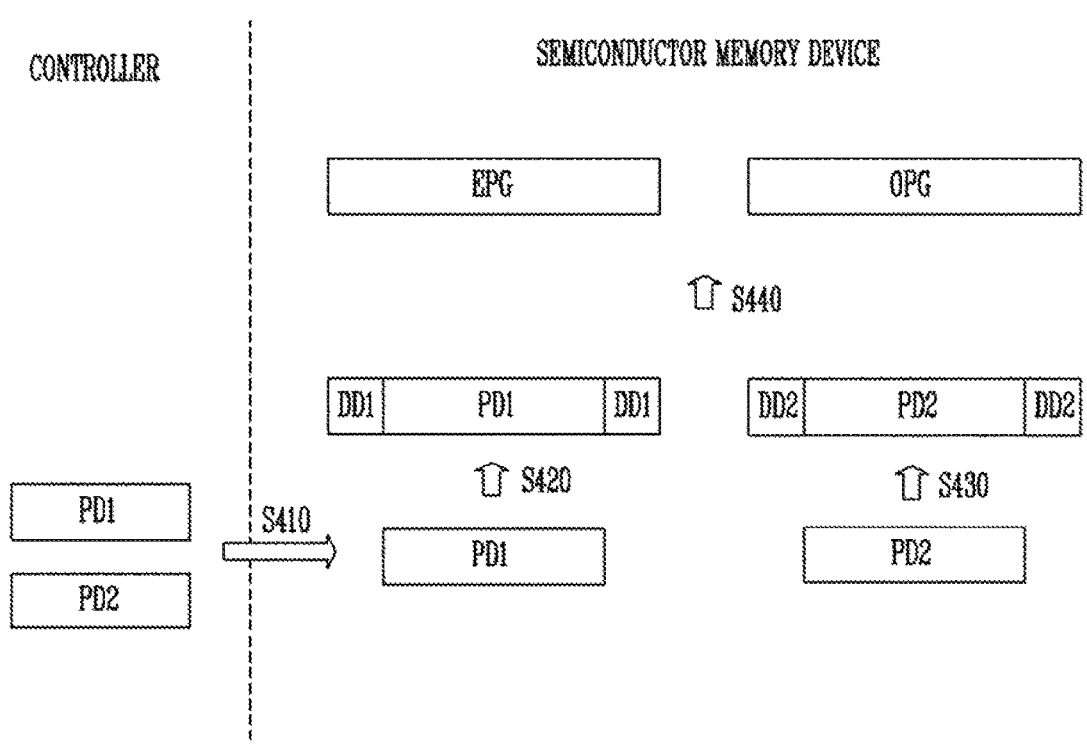
FIG. 19 is an illustration of a program operation of first and second partial data in response to a special program command, according to an embodiment of the present invention.

FIG. 18 is a flowchart Illustrating another example of step S120 of the method shown in FIG. 8. FIG. 19 illustrates the program operation of the first and second partial data PD1 and PD2 according to the step S120 shown in FIG. 18.

Referring to FIGS. 1, 8, 18 and 19, at steps S310 and S410, the controller 200 may control the program operation of the first partial data PD1 and the second partial data PD2 to the semiconductor memory device 100. It is noted that steps S310 and S410 do not include padding data, which is different from the example of FIGS. 16 and 17. The controller 200 may provide the first and second partial data PD1 and PD2 to the semiconductor memory device 100.

The controller 200 may provide a specific program command to the semiconductor memory device 100 so that the semiconductor memory device 100 may program unselected memory cells with dummy data DD1 and DD2 in a selected page. A column address of the physical block address may represent the first column region CR1 in both of the even and odd pages EPG and OPG.

At steps S320 and S420 and S440, the semiconductor memory device 100 may program the even page with the first dummy data DD1 along with the first partial data PD1.

The read and write circuit 123 of the semiconductor memory device 100 may receive the first partial data PD1 through the input/output circuit 124. The first partial data PD1 may be stored in the page buffers corresponding to the first column region CR1 of the even page EPG in the read and write circuit 123. In addition, the control logic 125 of the semiconductor memory device 100 may provide the first dummy data DD1 to the read and write circuit 123. The first dummy data DD1 may be stored in the page buffers corresponding to the second column region CR2 of the even page EPG in the read and write circuit 123.

The semiconductor memory device 100 may program the even page EPG with the first dummy data DD1 along with the first partial data PD1 by padding first dummy data DD1 to the first partial data PD1. The first dummy data DD1 may be padded so that the first partial data PD1 may be programmed to the memory cells of the first column region CR1 In the even page EPG and the first dummy data DD1 may be programmed to memory cells of the second column region CR2 in the even page EPG, as exemplified in FIGS. 11 and 19.

At steps S330 and S430 and S440, the semiconductor memory device 100 may program an odd page with the second dummy data DD2 along with the second partial data PD2.

The read and write circuit 123 of the semiconductor memory device 100 may receive the second partial data PD2 through the input/output circuit 124. The second partial data PD2 may be stored in the page buffers corresponding to the first column region CR1 of the odd page OPG in the read and write circuit 123. In addition, the control logic 125 of the semiconductor memory device 100 may provide the second dummy data DD2 to the read and write circuit 123. The second dummy data DD2 may be stored in the page buffers corresponding to the second column region CR2 of the odd page OPG in the read and write circuit 123.

The semiconductor memory device 100 may program the odd page OPG with the second dummy data DD2 along with the second partial data PD2 by padding second dummy data DD2 to the second partial data PD2. The second dummy data DD2 may be padded so that the second partial data PD2 may be programmed to the memory cells of the first column region CR1 in the odd page OPG and the second dummy data DD2 may be programmed to memory cells of the second column region CR2 in the odd page OPG, as exemplified in FIGS. 11 and 19.

Each of the first and second dummy data DD1 and DD2 may have a predetermined data pattern. According to the data pattern, threshold voltages of the selected memory cells may be prevented from being changed by threshold voltages of the unselected memory cells.

At step S440, the selected page may be programmed with the data stored in the read and write circuit 123. Therefore, memory cells corresponding to the first column region CR1 of the even page EPG may be programmed with the first partial data PD1, and memory cells corresponding to the first column region CR1 of the odd page OPG may be programmed with the second partial data PD2. Memory cells corresponding to the second column region CR2 of the even page EPG may be programmed with the first dummy data DD1, and memory cells corresponding to the second column region CR2 of the odd page OPG may be programmed with the second dummy data DD2.

According to an embodiment, steps S320 and S330 or steps S420 to S440 may be performed through a single program operation. For example, the controller 200 may control the single program operation by transferring the program command, a physical block address corresponding to the even page EPG and the odd page OPG, and the first and second partial data PD1 and PD2 to the semiconductor memory device 100 so that the first partial data PD1 with the first dummy data DD1 may be programmed in the even page EPG while the second partial data PD2 with the second dummy data DD2 may be programmed in the odd page EPG. A column address of the physical block address may represent the even page EPG, the odd page OPG, or the entire selected page or any combination thereof.

Steps S320 and S330 or steps S420 to S440 may be performed through different program operations. For example, the controller 200 may transfer a first specific program command, a first physical block address and the first partial data PD1 to the semiconductor memory device 100 so that the first partial data PD1 may be programmed in an even page EPG. Subsequently, the controller 200 may transfer a second specific program command, a second physical block address and the second partial data PD2 to the semiconductor memory device 100 so that the second partial data PD2 may be programmed in an odd page OPG. A column address of the first physical block address may represent the first column region CR1 in the even page of the selected page. A column address of the second physical block address may represent the first column region CR1 of the odd page of the selected page.

Figure 20:
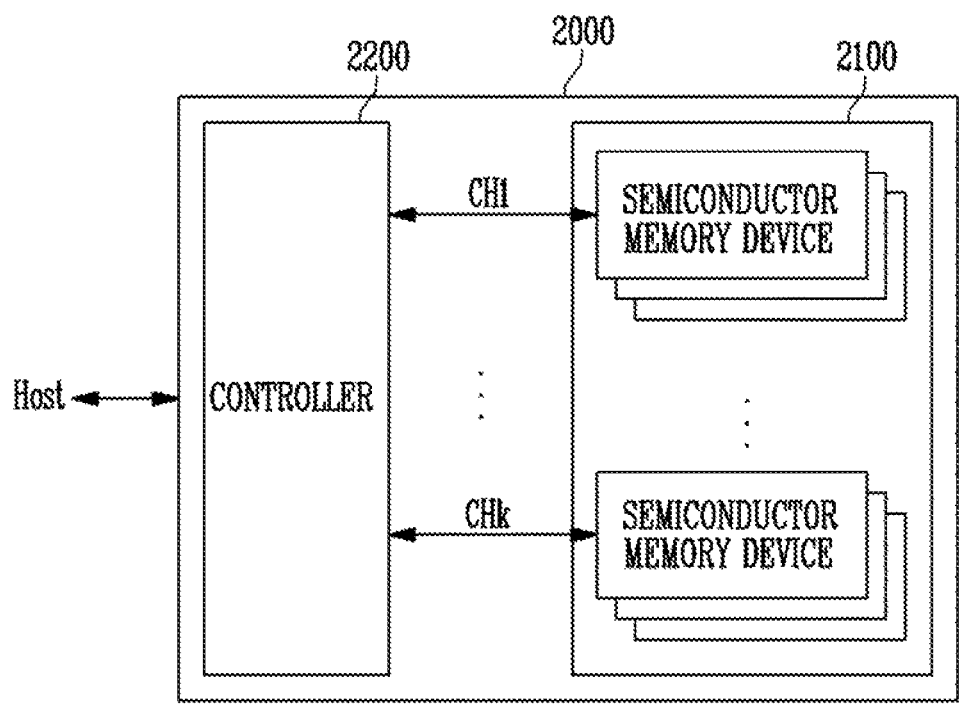
FIG. 20 is a block diagram illustrating an application example of a memory system, according to an embodiment of the present invention.

FIG. 20 is a block diagram Illustrating an application example (2000) of a memory system, according to an embodiment of the invention. Accordingly, the memory system 2000 may include a semiconductor memory device 2100 and a controller 2200. The semiconductor memory device 2100 may include a plurality of semiconductor data chips. The plurality of semiconductor data chips may be divided into a plurality of groups.

The plurality of groups may communicate with the controller 2200 through first to kth channels CH1 to CHk, respectively, as shown in FIG. 20. Each of the semiconductor data chips may be configured and operated in substantially the same manner as the semiconductor memory device 100 described above with reference to FIG. 1.

Each of the groups may communicate with the controller 2200 through a single common channel. The controller 2200 may be configured in substantially the same manner as the controller 200 described above with reference to FIG. 1, and configured to control the plurality of data chips of the semiconductor memory device 2100 through the plurality of channels CH1 to CHk.

FIG. 20 illustrates the plurality of semiconductor data chips coupled to a single channel. However, the memory system 2000 may be modified so that a single semiconductor data chip may be coupled to a single channel.

The controller 2200 and the semiconductor memory device 2100 may be integrated in one semiconductor device. According to an embodiment, the controller 2200 and the semiconductor memory device 2100 may be integrated in a single semiconductor device to form a memory card such as a PC card (personal computer memory card International association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 2200 and the semiconductor memory device 2100 may be integrated in a single semiconductor device to form a solid state drive (SSD). The SSD may include a storage device for storing data in a semiconductor memory device. When the memory system 2000 is used as an SSD, operational rates of the host coupled to the memory system 2000 may be significantly improved.

In another example, the memory system 2000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, and the like.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), and the like.

Figure 21:
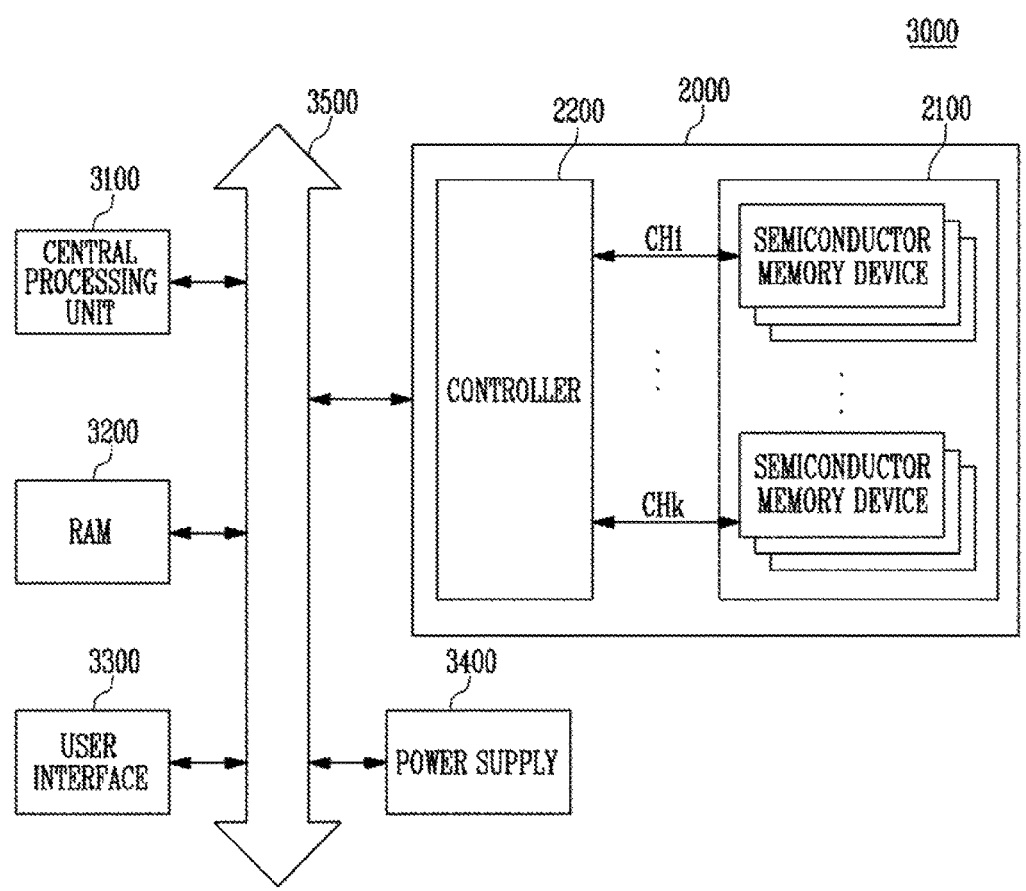
FIG. 21 is block diagram illustrating a computing system including a memory system as shown in FIG. 20, according to an embodiment of the present invention.

FIG. 21 illustrates a computing system 3000 having the memory system 2000 described above with reference to FIG. 20.

The computing system 3000 may include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user Interface 3300 and the power supply 3400 through the system bus 3500. Data provided through the user interface 3300 or processed by the central processing unit 3100 may be stored in the memory system 2000.

In FIG. 21, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 21, the memory system 2000 shown in FIG. 20 may be included as the memory system 3000. However, the memory system 2000 may be replaced with the memory system 1000 shown in FIG. 12. According to an embodiment, the computing system 3000 may include both of the memory systems 1000 and 2000 described above with reference to FIGS. 1 and 20, respectively.

According to various embodiments of the invention, when main data which is partially stored in a single page is programmed, first partial data and second partial data may be programmed to the same column region of a first half page and a second half page, respectively. Therefore, reliability of the main data stored in the page may be improved.

According to various embodiments of the invention, a memory device and system having improved reliability may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. An operating method of a memory system including a plurality of pages each page including first one half page and a second one half page, the operating method comprising:
acquiring first and second partial data from main data;
performing a first program operation to the first one half page of a selected page with the first partial data; and
performing a second program operation to the second one half page of the selected page with the second partial data;
wherein the first and second partial data are programmed in the same first column region in the first and second one half pages, respectively, and
wherein the first program operation and the second program operation are concurrently performed in response to a single program command.

2. The operating method of claim 1,
wherein first dummy data is programmed in a second column region in the first half page during the first program operation; and wherein second dummy data is programmed in a second column region in the second one half page during the second program operation.

3. The operating method of claim 2, wherein each of the first and second dummy data has a predetermined data pattern.

4. The operating method of claim 2, wherein the first program operation and the second program operation are sequentially performed in response to different program commands.

5. The operating method of claim 1, wherein the first column region is arranged in a substantially middle location of each of the first and second one half pages.

6. The operating method of claim 1, wherein the size of the main data is smaller than the size of an entire page.

7. The operating method of claim 1, wherein the first and second partial data have substantially the same size.

8. The operating method of claim 1, wherein the first and second one half pages are arranged alternately with each other.

9. A memory system, comprising:
a semiconductor memory device including a plurality of pages, each including first and second one half pages; and
a controller suitable for:
acquiring first and second partial data from main data;
performing a first program operation to the first one half page of a selected page with the first partial data; and
performing a second program operation to the second one half page of the selected page with the second partial data,
wherein the controller programs the first and second partial data in the same first column region in the first and second one half pages, respectively, and
wherein the controller concurrently performs the first program operation and the second program operation in response to a single program command.

10. The memory system of claim 9,
wherein the controller programs first dummy data in a second column region in the first one half page during the first program operation, and
wherein the controller programs second dummy data in a second column region in the second one half page during the second program operation.

11. The memory system of claim 10, wherein each of the first and second dummy data has a predetermined data pattern.

12. The memory system of claim 10, wherein the controller sequentially performs the first program operation and the second program operation in response to different program commands.

13. The memory system of claim 9, wherein the first column region is arranged in a substantially middle location of each of the first and second one half pages.

14. The memory system of claim 9, wherein the size of the main data is smaller than the size of an entire page.

15. The memory system of claim 9, wherein the first and second partial data have substantially the same size.

16. The memory system of claim 9, wherein the first and second one half pages are arranged alternately with each other.

17. A control method of a plurality of pages each including first and second one half pages, comprising:
providing main data to be partially stored in a selected page;

performing a main program operation to the same first column region in the first and second one half pages of the selected page with the main data; and performing a dummy program operation to the same second column region in the first and second one half pages of the selected page with dummy data during the main program operation.

18. The control method of claim 17, wherein the main data comprises first and second partial data, wherein the dummy data comprises first and second dummy data, wherein the performing of the main program operation includes:

performing a first main program operation to the first column region in the first one half page with the first partial data; and performing a second main program operation to the first column region in the second one half page with the second partial data, and wherein the performing of the dummy program operation includes:

performing a first dummy program operation to the second column region in the first one half page with the first dummy data during the first main program operation; and performing a second dummy program operation to the second column region in the second one half page with the second dummy data during the second main program operation.

\* \* \* \* \*